(12) United States Patent
Abrams et al.

(10) Patent No.: US 7,740,901 B2
(45) Date of Patent: *Jun. 22, 2010

(54) LOW TEMPERATURE METHOD OF MAKING A ZINC OXIDE COATED ARTICLE AND THE COATED ARTICLE MADE THEREBY

(75) Inventors: Michael B. Abrams, Bala Cynwyd, PA (US); Roman Y. Korotkov, King of Prussia, PA (US); Gary S. Silverman, Chadds Ford, PA (US); Ryan C. Smith, Collegeville, PA (US); Jeffery L. Stricker, Narberth, PA (US)

(73) Assignees: Pilkington Group Limited, St. Helens, Merseyside (GB); Arkema, Inc., King of Prussia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/800,065

(22) Filed: May 3, 2007

(65) Prior Publication Data

US 2008/0063793 A1    Mar. 13, 2008

Related U.S. Application Data

(60) Provisional application No. 60/843,185, filed on Sep. 8, 2006.

(51) Int. Cl.
    *B05D 5/12*    (2006.01)
(52) U.S. Cl. .................. 427/109; 427/108; 427/126.3
(58) Field of Classification Search ............... 427/108, 427/109, 126.3
    See application file for complete search history.

(56) References Cited

U.S. PATENT DOCUMENTS

| | | | |
|---|---|---|---|
| 4,508,054 A | 4/1985 | Baumberger et al. | |
| 4,751,149 A * | 6/1988 | Vijayakumar et al. | 428/702 |
| 4,990,286 A | 2/1991 | Gordon et al. | |
| 5,090,985 A * | 2/1992 | Soubeyrand et al. | 65/60.52 |
| 5,306,522 A | 4/1994 | Clough et al. | |
| 5,407,743 A | 4/1995 | Clough et al. | |
| 6,071,561 A * | 6/2000 | Gordon et al. | 427/255.33 |
| 6,416,814 B1 | 7/2002 | Giolando | |
| 2004/0023432 A1* | 2/2004 | Haga | 438/104 |
| 2005/0186342 A1* | 8/2005 | Sager et al. | 427/248.1 |

OTHER PUBLICATIONS

Jeffrey et al. (Chemical Vapor Deposition Polymerization: published by Springer, 2003, pp. 14-15).*
Hu et al. (Textured Fluorine-Doped ZnO films by Atmospheric CVD, Solar Cells, Elsevier, vol. 30, No. ¼ (1991), pp. 437-450).*
Smith, Frank, T.J., "Metal Organic Chemical Vapor Deposition of Oriented ZnO Films Over Large Areas", Applied Physics Letters, vol. 43, No. 12 (1983) pp. 1108-1110.
Gerfin and Dahmen, CVD of Nonmetals, (W.S. Rees, Jr., ed., VCH Publishers, Inc., New York, NY, 1996, Chapter 3, pp. 180-191.
Hu, J., et al., "Textured Fluorine-Doped ZnO Films by Atmospheric Chemical Vapor Deposition and Their Use in Amorphous Silicon Solar Cells", Solar Cells, Elsevier Sequoia, S.A., vol. 30,No. ¼, (1991), pp. 437-450.

* cited by examiner

*Primary Examiner*—Nadine G Norton
*Assistant Examiner*—Mahmoud Dahimene
(74) *Attorney, Agent, or Firm*—Marshall & Melhorn, LLC

(57) ABSTRACT

An atmospheric chemical vapor deposition method of making a zinc oxide coated glass article, made by directing one or more streams of gaseous reactants, specifically a zinc containing compound, and an oxygen containing compound, onto a surface of a transparent substrate material heated to a temperature of 400° C. or less.

16 Claims, 1 Drawing Sheet

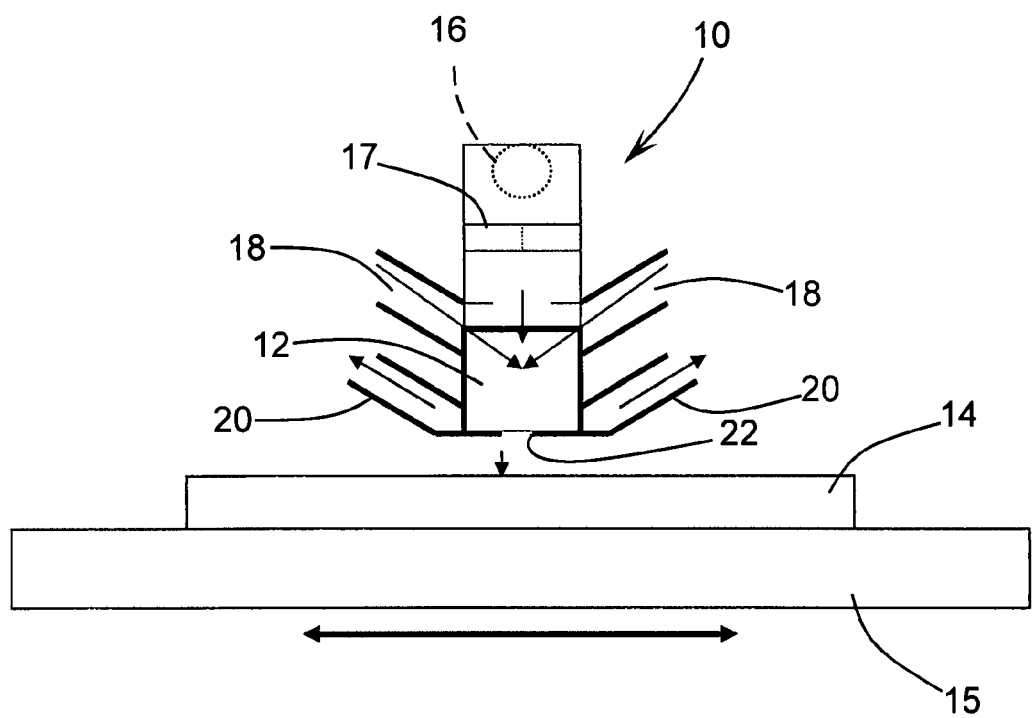

LOW TEMPERATURE METHOD OF MAKING A ZINC OXIDE COATED ARTICLE AND THE COATED ARTICLE MADE THEREBY

RELATED APPLICATION

This application is claiming the benefit, under 35 U.S.C. 119(e) of the provisional application filed Sep. 8, 2006 under 35 U.S.C. 111(b) which was granted Ser. No. 60/843,185 filed Sep. 8, 2006. This provisional application hereby incorporated by reference.

BACKGROUND OF THE INVENTION

The present invention is related to a method of depositing a zinc oxide coating on a transparent substrate. More particularly, it is related to a chemical vapor deposition method of depositing a zinc oxide coating on a transparent substrate which coating is modified to create a zinc oxide coating having a combination of desired properties.

Growth of zinc oxide coatings by CVD has been reported in the scientific literature. For example, Smith, Frank T. J., "Metalorganic chemical vapor deposition of oriented ZnO films over large areas", Applied Physics Letters, Vol. 43, No. 12 (1983) pg. 1108-1110, describes a metal organic chemical vapor deposition process for preparing c-axis-oriented ZnO films in a system similar to that which is commercially available for $SiO_2$ deposition. The resulting films are said to be highly uniform in thickness and to adhere to a variety of substrates.

Gerfin and Dahmen in *CVD of Nonmetals* (W. S. Rees, Jr. ed., VCH Publishers, Inc., New York, N.Y., 1996), chapter 3, pg. 180-185, describe the work of a number of researchers regarding the use of a variety of chemical preparation techniques to form zinc oxide films. Use of dialkyl zinc compounds and various oxygen-containing compounds is discussed.

Deposition of zinc oxide films has also been described in the patent literature.

U.S. Pat. No. 4,751,149 to Vijaykumar, P., et al. describes a low temperature (200° C. or less) low pressure (2 torr or less) static deposition method for zinc oxide films, utilizing an organozinc compound and water carried in an inert gas. The resulting zinc oxide film is said to have a low resistivity which can be varied by addition of a Group 13 element.

U.S. Pat. No. 4,990,286 to Gordon, R., et al. describes deposition of fluorine-doped zinc oxide films by chemical vapor deposition from vapor mixtures of zinc, oxygen and fluorine-containing compounds. The films produced are said to be highly electrically conductive, transparent to visible light, reflective to infrared radiation, and absorbing to ultraviolet light. Temperature sensitive substrates are said to be suitable with the process of the subject invention.

U.S. Pat. No. 5,306,522 describes processes for coating a substrate, in particular, substrates including shielded surfaces, coated with zinc oxide containing coatings. The described processes include the elements of contacting a substrate with a zinc oxide precursor, preferably maintaining the precursor coated substrate at conditions to equilibrate the coating, then oxidizing the precursor to form a coating containing zinc oxide. The substrates coated by the process for use in various applications, are also described.

U.S. Pat. No. 5,407,743, which is related to the above-mentioned U.S. Pat. No. 5,306,522, includes additional information related particularly to the zinc oxide coated articles made by the described process.

U.S. Pat. No. 6,416,814 to Giolando, D. describes the use of ligated compounds of tin, titanium, and zinc as metal oxide precursor compounds in a method to produce high quality metal oxide coatings when coming in contact with a heated substrate.

Durable, coated transparent substrate materials are increasingly in demand. It would be desirable to have zinc oxide coated transparent substrate materials exhibiting high visible light transmittance, low emissivity properties and/or solar control properties, high electrical conductivity/low sheet resistance, and which could be manufactured cost effectively.

BRIEF DESCRIPTION OF THE DRAWINGS

Various other objects, features and attendant advantages of the present invention will be more fully appreciated as the same becomes better understood from the following detailed description when considered in connection with the accompanying drawing.

The FIGURE is a schematic representation of the dynamic coater nozzle utilized in Example 21, in accordance with the invention.

SUMMARY OF THE INVENTION

The present invention relates to an atmospheric chemical vapor deposition method of making a zinc oxide coated transparent product comprising a transparent substrate material heated to a temperature <400° C., directing one or more streams of gaseous reactants comprising a zinc containing compound, and one or more oxygen containing compounds onto a surface of the heated substrate to deposit a zinc oxide coating thereon. Optionally, the zinc oxide coating may be made electrically conductive by addition of a dopant material to the one or more gaseous reactant streams.

DETAILED DESCRIPTION OF THE INVENTION

This invention is a cost effective method of making pyrolytic zinc oxide coatings at commercially viable growth rates on transparent substrate materials having a glass transition point, Tg (softening point) less than 400° C. The present invention overcomes the previous obstacles to making such doped zinc oxide films on a variety of possible transparent substrate materials, with the zinc oxide film being deposited at a substrate temperature of less than 400° C., preferably between 80° C. and 400° C.

While any suitable method of atmospheric pressure chemical vapor deposition may be utilized in connection with the present invention, the method of deposition disclosed in U.S. Pat. No. 6,268,019 to Atofina Chemicals, Inc. is preferred. The '019 patent is incorporated herein by reference, in its entirety. The method of the '019 patent has been shown to be capable of depositing metal oxide films of various kinds, at commercially useful growth rates, for example, at greater than 5 nm/sec. The precursor gases are delivered to a gas mixing chamber a predetermined distance above a surface of the substrate. The precursor gases are mixed together in the gas mixing chamber to form a precursor mixture which, upon exiting the gas mixing chamber, contacts the surface of the substrate as it moves outside of and past the gas mixing chamber. The deposition method of the '019 patent also has the advantage of being able to vary the mixing time of the reactant materials which, in turn, allows "tuning" of the properties of, in this instance, zinc oxide coatings. In particular, the present invention demonstrates the benefits of utilizing multiple precursor compounds, which benefits will be discussed in greater detail herein. Such zinc oxide coated products when doped, are useful as for example a transparent conductive oxide. Undoped zinc oxide coatings may be useful in a variety of coating stack configurations for refractive index matching purposes.

More specifically, possible applications of doped zinc oxide coatings made by the method of the present application include, but are not limited to: Thin Film Photovoltaic and Organic Photovoltaics (OPV) devices, flat panel displays, solid state lighting (LEDs and OLEDs), touch panel screens, transparent thin film resistors (TFT) that have application in RFID tags and integrated circuits, as well as low emissivity and solar control coating stacks.

Suitable zinc containing compounds include, but are not limited to compounds of the general formula $R^1R^2ZnL_z$ or $R^1R^2Zn\cdot[R^3R^4N(CHR^5)_n(CH_2)_m(CHR^6)_nNR^7R^8]$, where $R^{1-8}$ can be the same or different alkyl or aryl groups such as methyl, ethyl, isopropyl, n-propyl, n-butyl, sec-butyl, phenyl or substituted phenyl, and may include one or more fluorine-containing substituents, L is a oxygen-based, commercial, neutral ligand such as tetrahydrofuran, methyl trihydrofuran, furan, diethyl or dibutyl ether, methyl tert-butyl ether, or dioxane and z=0-2. $R^5$ and $R^6$ can be H or alkyl or aryl groups, n can be 0 or 1, and m can be 1-6 if n is 0, and m can be 0-6 if n is 1.

Other suitable zinc compounds may include a dialkyl zinc glycol alkyl ether of the formula:

$R^9_2Zn\cdot[R^{10}O(CH_2)_2O(CH_2)_2OR^{10}]$, where $R^9$ is a short chain, saturated organic group having 1 to 4 carbon atoms and $R^{10}$ is a short chain, saturated organic group having 1 to 4 carbon atoms. Preferably, $R^9$ is a methyl or ethyl group ($C_2H_5$—) and $R^{10}$ is a methyl group ($CH_3$—) and is referred to as diethylzinc (DEZ) diglyme having the formula:

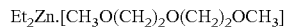

$Et_2Zn\cdot[CH_3O(CH_2)_2O(CH_2)_2OCH_3]$

Other tridentate ligands capable of chelating the dialkyl zinc moiety that may be useful in connection with the present invention include: compounds of the formula $[R^{11}C(OR^{12})_3]$ where $R^{11}$ is H or a short chain, saturated organic group having 1 to 4 carbon atoms or a phenyl group and $R^{12}$ is a short chain, saturated organic group having 1 to 4 carbon atoms as described above, where $R^{11}$ and $R^{12}$ may be the same or different, triamine ligands of the formula $[R^{13}_2N(CH_2)_2N(R^{14})(CH_2)_2NR^{13}_2]$ where $R^{13}$ is a short chain, saturated organic group having 1 to 4 carbon atoms and compounds where $R^{14}$=a phenyl group ($C_6H_5$) or a substituted phenyl group. Diphenyl zinc compounds may also be useful in connection with the present invention.

Suitable oxygen containing compounds include, but are not limited to: organic acetates, for example, ethyl acetate (EtOAc), t-butyl acetate (t-BuOAc), alcohols (including perfluorinated derivatives), oxygen, and water: with $H_2O$ or water-containing alcohol being preferred.

An inert carrier gas, such as nitrogen, helium, or the like may also be utilized as a component of the gaseous reactant stream of the present invention.

If the transparent substrate material is glass, it may be formed by any suitable method, but is preferably a continuous glass ribbon formed by the well known float glass process as described in U.S. Pat. Nos. 3,356,474, 3,433,612, 3,531,274 and 3,790,361, each of which is herein incorporated by reference in its entirety.

Other suitable substrate materials include, but are not limited to polymethylmethacrylate (pMMA), polyethylene terphthalate (PET), polyamides, polyimides, polylactic acid (PLA) and polycarbonate materials.

If desired, properties of, at least, electrical conductivity can be imparted to the zinc oxide coating by adding one or more dopant materials to the one or more gaseous reactant streams. Suitable dopants include, but are not limited to fluorine-containing compounds, and Group 13 metal-containing precursors:

Suitable fluorine containing compounds include, but are not limited to: difluoromethane, 1,1-difluoroethane, 1,1,1,2-tetrafluoroethane, 1,1,1,2,2-pentafluoroethane, 1,1,1-trifluoroethane, 1,1,1,3,3-pentafluoropropane, fluoroethene, 1,1-difluoroethene, 1,1,1,2,3,3,3-heptafluoropropane, 1,1,1,2,2,3,3-heptafluoropropane, hexafluoropropene, 3,3,3-trifluoropropene, perfluorocyclopentene, perfluorobutadiene, 1,1,1,3,3,3-hexafluoro-2-propanol, 1,1,1,3,3,3-hexafluoro-2-methyl-2-propanol, hexafluoropropene oxide, 2,2,3,4,4,4-hexafluoro-1-butanol, 1,1,2,2,3,4-hexafluoro-3,4-bis(trifluoromethyl)cyclobutane, hexafluoro-2-butyne, hexafluoroacetone, hexafluoroglutaric anhydride, trifluoroacetic anhydride, trifluoroacetyl chloride, 2,2,2-trifluoroethanol, 1,1,1-trifluoroacetone, trifluoromethane, 1,1,1-trifluoro-2-propanol, 3,3,3-trifluoropropionic acid, 3,3,3-trifluoropropyne, trifluoroamine, hydrogen fluoride, trifluoroacetic acid, 1,1,1,3,3-pentafluorobutane, and 1,1,1,2,3,4,4,5,5,5-decafluoropentane.

Suitable Group 13 metal containing precursors include those of the general formula $R^{15}_{(3-n)}MR^{16}n$ or $R^{15}_3M(L)$ wherein M=one of B, Al, Ga, In or Tl, $R^{15}$ is an alkyl or aryl or halide or alkoxide group, $R^{16}$ is an H, alkyl, aryl, halide or diketonate group with formula $(R^{17}C(O)CR^{18}C(O)R^{19})$ in which $R^{17-19}$ may be the same or different and are H, alkyl, or aryl groups (including cyclic and partially-and perfluorinated derivatives), where L is an oxygen-based, commercial, neutral ligand such as methyltrihydrofuran, tetrahydrofuran, furan, diethyl or dibutyl ether, dioxane and n=0-3. $Me_2Ga$ (hfac) (hfac=hexafluoroacetylacetonate, $F_3CC(O)CHC(O)CF_3$), $Me_2Ga(acac)$, $Et_2Al(acac)$ (acac=acetylacetonate, $H_3CC(O)CHC(O)CH_3$), and $Et_2AlCl$ are preferred Group 13 compounds.

It is preferred that zinc oxide films made by the process of the present invention be doped with one or more of the aforementioned dopant materials.

The following non-limiting examples illustrate certain aspects of the present invention.

EXAMPLES

The APCVD apparatus used in examples 1-20 is similar to that described in U.S. Pat. No. 6,268,019 B1. A key feature of the apparatus is the ability to control the mixing time of the gaseous reagents by feeding the vapors separately to the coating nozzle. In these experiments the coating nozzle consisted of concentric tubes: a ⅜" tube fed into a 1" tube via compression fitting that allows the length of the mixing zone to be adjusted, and an outer 1.5" tube connected to an exhaust blower for removal of by-products and unreacted vapors. The films resulting from this nozzle configuration were circular with diameter approximately 1.5".

The APCVD apparatus used in example 21 is illustrated in the FIGURE, and consists of a single slot coater 10 which contains a mixing chamber 12 where two separate precursor streams can be combined controllably prior to contacting the surface of the substrate 14, which is supported on a nickel heating block 15. The first stream is introduced through the header 16 and flows downward through a distribution plate 17, while the second stream is introduced through side inlet ports 18. The mixing chamber is 1.25-inch in length. For total nitrogen carrier gas flow of 15 l/min the mixing time of the two precursor streams is approximately 280 milliseconds. Deposition by-products and unreacted precursor vapors are removed via two exhaust slots 20 (adjacent to the coating slot 22) connected to an exhaust blower (not shown). The films resulting from this nozzle are approximately 4-inch in width. Heated substrates may be transported below the nozzle to coat various lengths.

Examples 1-5 describe deposition of zinc oxide at 365° C. and varying $H_2O/Zn$ ratios between 3 and 12, utilizing the previously described deposition method. Examples 6-10 describe deposition of zinc oxide at 280° C. and varying $H_2O/Zn$ ratios between 3 and 12. Example 11-15 describe deposition of zinc oxide at 190° C. and varying $H_2O/Zn$ ratios: between 3 and 12. Examples 16-17 describe deposition of zinc oxide at 155° C. and varying $H_2O/Zn$ ratios between 3 and 6. Examples 18-20 describe deposition of Al-doped ZnO at 200° C. Example 21 describes the deposition of Ga-doped ZnO at approximately 200° C. For all the above examples, reactant concentrations were calculated based on the concentrations present once all streams were combined.

Examples 1-5

Borosilicate glass (1.1mm thick) was heated to 365° C. (measured by contact thermocouple at substrate surface) on a nickel heating block. A gas mixture of 0.08 mol % $Et_2Zn.TEEDA$ (TEEDA=N,N,N',N'-tetraethyl ethylenediamine) in 30 l/min nitrogen carrier gas at a temperature of 180° C. was fed through the primary chemical feed of the coating nozzle. In a separate feed, a gas mixture of 0.24 mol % to 0.97 mol %, respectively water vapor (evaporated in vaporizer 1) in 2.2 l/min of nitrogen carrier gas was fed to the coater's inner tube thus, resulting in $H_2O/Zn$ ratios between 3 and 12.

The inner feed tube was adjusted such that the mixing zone length was 15 cm. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec (milliseconds).

The substrate was pre-dosed for 5 seconds with the water vapor gas mixture immediately prior to beginning the flow of Zn precursor. The deposition rates varied between 8.87 nm/sec and 6.45 nm/sec, with the highest deposition rate occurring when the $H_2O/Zn$ ratio was 9, and the lowest deposition rate occurring when the $H_2O/Zn$ ratio was 12.

Examples 6-10

Borosilicate glass (1.1mm thick) was heated to 280° C. (measured by contact thermocouple at substrate surface) on a nickel heating block. A gas mixture of 0.08 mol % $Et_2Zn.TEEDA$ in 30 l/min nitrogen carrier gas at a temperature of 180° C. was fed through the primary chemical feed of the coating nozzle. In a separate feed, a gas mixture of 0.24 mol[1] % to 0.97 mol %, respectively, water vapor (evaporated in vaporizer 1) in 2.2 l/min of nitrogen carrier gas, was fed to the coater's inner tube, thus, resulting in $H_2O/Zn$ ratios between 3 and 12.

The inner feed tube was adjusted such that the mixing zone length was 15 cm. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec. The substrate was pre-dosed for 5 seconds with the water vapor immediately prior to beginning the flow of Zn precursor to the substrate. The deposition ratio varied between 9.28 nm/sec and 6.84 nm/sec, with the highest deposition rate occurring when the $H_2O/Zn$ ratio was 3, and the lowest deposition rate occurring when the $H_2O/Zn$ ratio was 12.

Examples 11-15

Borosilicate glass (1.1mm thick) was heated to 190° C. (measured by contact thermocouple at substrate surface) on a nickel heating block. A gas mixture of 0.08 mol % $Et_2Zn.TEEDA$ in 30 l/min nitrogen carrier gas at a temperature of 180° C. was fed through the primary chemical feed of the coating nozzle. In a separate feed, a gas mixture of 0.24 mol % to 0.97 mol % water vapor (evaporated in vaporizer 1) was fed to the coater's inner tube in 2.2 l/min of nitrogen carrier gas.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec.

The substrate was pre-dosed for 5 s by the water vapor immediately prior to beginning the flow of Zn precursor to the substrate. The deposition rate varied between 8.50 nm/sec and 8.02 nm/sec with the highest deposition rate occurring when the $H_2O/Zn$ ratio was 9, and the lowest deposition rate occurring when the $H_2O/Zn$ ratio was 6.

Examples 16-17

Borosilicate glass (1.1mm thick) was heated to 155° C. (measured by contact thermocouple at substrate surface) on a nickel heating block. A gas mixture of 0.08 mol % $Et_2Zn.TEEDA$ in 30 l/min nitrogen carrier gas at a temperature of 180° C. was fed through the primary chemical feed of the coating nozzle. In a separate feed, a gas mixture of 0.24 mol % to 0.49 mol % water vapor (evaporated in vaporizer 1) in 2.2 l/min of nitrogen carrier gas was fed to the coater's inner tube.

The inner feed tube was adjusted such that the mixing zone length was 15 cm. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec.

The substrate was pre-dosed for 5 s with the water vapor gas mixture immediately prior to beginning the flow of Zn and Ga precursor. The deposition rates varied between 5.82 nm/sec and 6.14 nm/sec with the highest deposition rate occurring when the $H_2O/Zn$ ratio was 3, and the lowest deposition rate occurring when the $H_2O/Zn$ ratio was 6.

TABLE 1

| Examples | Depo. Temp. (° C.) | $H_2O/Zn$ Ratio | Dep. Rate (nm/s) |
| --- | --- | --- | --- |
| 1 | 365 | 6 | 7.71 |
| 2 | 365 | 3 | 7.32 |
| 3 | 365 | 9 | 7.87 |
| 4 | 365 | 12 | 6.45 |
| 5 | 365 | 6 | 6.84 |
| 6 | 280 | 6 | 7.47 |
| 7 | 280 | 3 | 9.28 |

TABLE 1-continued

| Examples | Depo. Temp. (° C.) | H$_2$O/Zn Ratio | Dep. Rate (nm/s) |
|---|---|---|---|
| 8 | 280 | 9 | 8.73 |
| 9 | 280 | 12 | 6.84 |
| 10 | 280 | 6 | 8.81 |
| 11 | 190 | 6 | 8.02 |
| 12 | 190 | 3 | 8.18 |
| 13 | 190 | 9 | 8.50 |
| 14 | 190 | 12 | 8.18 |
| 15 | 190 | 6 | 8.34 |
| 16 | 155 | 6 | 5.82 |
| 17 | 155 | 3 | 6.14 |

As seen in the above examples, the ZnO deposition rate was relatively consistent, at commercially viable deposition rates, between 190° C. and 365° C. As the substrate temperature falls below 190° C. a significant decrease in deposition rate was observed.

Example 18

Borosilicate glass (0.7 mm thick) was heated to 200° C. (measured by contact thermocouple at substrate surface) on a nickel heating block. A gas mixture of 0.45 mol % Et$_2$Zn.TMPDA (TMPDA=N,N,N',N'-tetramethyl-1,3-propandiamine) and 0.0072 mol % Et$_2$Al(acac) in 30 l/min nitrogen carrier gas at a temperature of 180° C. was fed through the primary chemical feed of the coating nozzle. In a separate feed, a gas mixture of 2.73 mol % water vapor (evaporated in vaporizer 1) and 1.59 mol % hexafluoropropene was fed to the coater's inner tube in 2.2 l/min of nitrogen carrier gas.

The inner feed tube was adjusted such that the mixing zone length was 15 cm. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec.

The substrate was pre-dosed for 5 sec by the water vapor/hexafluoropropene mixture immediately prior to beginning the flow of Zn and Al precursors to the substrate. The deposition rate varied between 35 nm/sec and 42 nm/sec, resulting in films 850-1000 nm thick. The sheet resistance was measured to be 50-55 ohm/sq and the film resistivity was $5 \times 10^{-3}$ ohm·cm.

Example 19

Borosilicate glass (0.7 mm thick) was heated to 200° C. (measured by contact thermocouple at substrate surface) on a nickel heating block. A gas mixture of 0.059 mol % Et$_2$Zn.TMPDA (TMPDA=N,N,N',N'-tetramethyl-1,3-propandiamine) and 0.0055 mol % Et$_2$AlCl in 30 L/min nitrogen carrier gas at a temperature of 180° C. was fed through the primary chemical feed of the coating nozzle. In a separate feed, a gas mixture of 0.78 mol % 2-butanol (containing 5 mol % H$_2$O) and 0.81 mol % hexafluoropropylene was fed to the coater's inner tube in 2.2 l/min of nitrogen carrier gas.

The inner feed tube was adjusted such that the mixing zone length was 15 cm. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec.

The deposition rate was 8.5 nm/sec, resulting in a film 380 nm thick. The sheet resistance was measured to be 51 ohm/sq and the film resistivity was $2 \times 10^{-3}$ ohm·cm.

Example 20

Borosilicate glass (0.7 mm thick) was heated to 200° C. (measured by contact thermocouple at substrate surface) on a nickel heating block. A gas mixture of 0.059 mol % Et$_2$Zn.TMPDA (TMPDA=N,N,N',N'-tetramethyl-1,3-propandiamine) and 0.011 mol % Et$_2$AlCl in 30 l/min nitrogen carrier gas at a temperature of 180° C. was fed through the primary chemical feed of the coating nozzle. In a separate feed, a gas mixture of 0.90 mol % 2-butanol (containing 20 mol % H$_2$O) and 0.81 mol % hexafluoropropene was fed to the coater's inner tube in 2.2 l/min of nitrogen carrier gas.

The inner feed tube was adjusted such that the mixing zone length was 15 cm. The nitrogen carrier gas flows were chosen such that the velocities of the two feeds were approximately equal. Under these conditions the face velocity at the exit of the coater nozzle was approximately 100 cm/s, which correlates to a reactant mixing time of approximately 150 msec.

The deposition rate was 9.5 nm/sec, resulting in a film 420 nm thick. The sheet resistance was measured to be 47 ohm/sq and the film resistivity was $2 \times 10^{-3}$ ohm·cm.

As can be seen in the results of Examples 18-20, the use of water in combination with an Al-containing dopant and an F-containing dopant (Ex. 18) provided high coating growth rates, but sheet resistance and film resistivity was somewhat higher than Ex. 19 and 20. Conversely, Examples 19 and 20 showed lower growth rates and desirable lower film resistivities utilizing an alcohol/water mixture as an oxygen containing compound.

Example 21

Borosilicate glass (0.7 mm thick) was heated to approximately 200° C. on a nickel heating block. A gas mixture of 0.26 mol % Me$_2$Zn.TMPDA (TMPDA=N,N,N',N'-tetramethyl-1,3-propandiamine) in 10 l/min nitrogen carrier gas at a temperature of 170° C. was fed through the primary feed of the coater nozzle. The dopant precursor, Me$_2$Ga(acac), was added to the primary feed stream via a stainless steel bubbler (16° C.) using nitrogen carrier gas at 30 sccm. In a secondary feed, 1.66 mol % water vapor in 5 l/min nitrogen carrier gas at a temperature of 170° C. was fed to the coater nozzle as illustrated in the FIGURE. The two precursor feeds were combined in a mixing chamber within the coater nozzle and directed to the surface of the heated glass substrate. Films were grown on a stationary substrate for 45 seconds.

The film deposition rate was 16 nm/s, resulting in films 730 nm thick. The film resistivity was measured to be $3.1 \times 10^{-2}$ ohm·cm. Hall effect measurement revealed a carrier concentration of $3.5 \times 10^{19}$ cm$^{-3}$ and mobility 5.7 cm$^2$/V·s.

The dynamic deposition system of Example 21 utilizing water and a gallium dopant produced ZnO films at commercially viable thicknesses and low film resistivity.

While this invention has been described with respect to various specific examples and embodiments, it is to be understood that the invention is not limited thereto, and that it can be variously practiced within the scope of the following claims.

What is claimed is:

1. A method of making a low resistivity zinc oxide coated transparent article comprising:
   providing a moving transparent substrate having a surface on which a coating is to be applied, the surface being at a temperature of 400° C. or less; and
   directing a precursor mixture formed in a gas mixing chamber, the precursor mixture comprising a zinc containing compound and one or more oxygen containing compounds, out of the gas mixing chamber to the surface on which the coating is to be deposited, the zinc containing compound and oxygen sources having been mixed together in the gas mixing chamber for a time <500 msec. before the precursor mixture exits the gas mixing chamber and contacts the surface of the substrate so that a zinc oxide coating is formed at atmospheric pressure on the surface at a deposition rate of at least 5 nm/second.

2. The method of making a low-resistivity, doped zinc oxide coated transparent article defined in claim 1 wherein the precursor mixture comprises a Group 13 element.

3. The method according to claim 2, wherein the Group 13 containing compounds comprises an aluminum containing compound.

4. The method according to claim 3, wherein the aluminum containing compound comprises an aluminum compound of the formula R15(3-n)AlR16nLz wherein R15 is an alkyl or aryl or halide or alkoxide group, R16 is an H, alkyl, aryl, halide or diketonate group with formula (R17C(O)CR18C(O)R19) in which R17-19 may be the same or different and are H, alkyl, or aryl groups (including cyclic and partially-and perfluorinated derivatives), n=0-3, where L is an oxygen-containing donor ligand and where z=0-2.

5. The method according to claim 4, wherein the aluminum containing compound comprises diethylaluminum acetylacetonate.

6. The method according to claim 4, wherein the aluminum containing compound comprises diethylaluminum chloride.

7. The method according to claim 2, wherein the Group 13 containing compound comprises a gallium containing compound.

8. The method according to claim 7, wherein the gallium containing compound comprises a gallium compound of the formula R15(3-n)GaR16nLz wherein R15 is an alkyl or aryl or halide or alkoxide group, R16 is an H, alkyl, aryl, halide or diketonate group with formula (R17C(O)CR18C(O)R19) in which R17-19 may be the same or different and are H, alkyl, or aryl groups (including cyclic and partially-and perfluorinated derivatives), n=0-3, where L is an oxygen-containing donor ligand and where z=0-2.

9. The method according to claim 8, wherein the gallium containing compound comprises dimethylgallium acetylacetonate.

10. The method according to claim 8, wherein the gallium containing compound comprises dimethylgallium hexafluoroacetylacetonate.

11. The method of making a low-resistivity, doped zinc oxide coated transparent article defined in claim 1 wherein the precursor mixture comprises a fluorine containing compound.

12. The method according to claim 11, wherein the fluorine containing compound is selected from one of the group of fluorine containing compounds consisting of:

difluoromethane, 1,1-difluoroethane, 1,1,1,2-tetrafluoroethane, 1,1,1,2,2-pentafluoroethane, 1,1,1-trifluoroethane, 1,1,1,3,3-pentafluoropropane, fluoroethylene, 1,1-difluoroethylene, 1,1,1,2,3,3,3-heptafluoropropane, 1,1,1,2,2,3,3-heptafluoropropane, hexafluoropropene, 3,3,3-trifluoropropene, perfluorocyclopentene, perfluorobutadiene, 1,1,1,3,3,3-hexafluoro-2-propanol, 1,1,1,3,3,3-hexafluoro-2-methyl-2-propanol, hexafluoropropene oxide, 2,2,3,4,4,4-hexafluoro-1-butanol, 1,1,2,2,3,4-hexafluoro-3,4-bis(trifluoromethyl)cyclobutane, hexafluoro-2-butyne, hexafluoroacetone, hexafluoroglutaric anhydride, trifluoroacetic anhydride, trifluoroacetyl chloride, 2,2,2-trifluoroethanol, 1,1,1-trifluoroacetone, trifluoromethane, 1,1,1-trifluoro-2-propanol, 3,3,3-trifluoropropionic acid, 3,3,3-trifluoropropyne, trifluoroamine, hydrogen fluoride, trifluoroacetic acid, 1,1,1,3,3-pentafluorobutane, and 1,1,1,2,3,4,4,5,5,5-decafluoropentane.

13. The method according to claim 12, wherein the fluorine containing compound is hexafluoropropene.

14. The method according to claim 1, wherein the oxygen containing compound comprises water.

15. The method according to claim 1, wherein the oxygen containing compound comprises a mixture of an alcohol and water in which the concentration of water in the mixture is 25 mol% or less.

16. The method according to claim 15, wherein the alcohol comprises 2-butanol.

* * * * *